US008056023B2

(12) United States Patent
Inoue et al.

(10) Patent No.: US 8,056,023 B2
(45) Date of Patent: Nov. 8, 2011

(54) DETERMINING MANUFACTURABILITY OF LITHOGRAPHIC MASK BY REDUCING TARGET EDGE PAIRS USED IN DETERMINING A MANUFACTURING PENALTY OF THE LITHOGRAPHIC MASK

(75) Inventors: Tadanobu Inoue, Kanagawa-ken (JP); David O. Melville, New York, NY (US); Hidemasa Muta, Tokyo-to (JP); Kehan Tian, Poughkeepsie, NY (US); Masahura Sakamoto, Kanagawa-ken (JP); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 12/334,482

(22) Filed: Dec. 14, 2008

(65) Prior Publication Data

US 2010/0153901 A1    Jun. 17, 2010

(51) Int. Cl.
*G06F 17/50* (2006.01)
(52) U.S. Cl. ........................................... 716/52; 716/56
(58) Field of Classification Search .................... 716/52, 716/55
See application file for complete search history.

(56) References Cited

U.S. PATENT DOCUMENTS

| | | | |
|---|---|---|---|
| 6,563,566 B2 | 5/2003 | Rosenbluth et al. | |
| 7,057,709 B2 | 6/2006 | Rosenbluth | |
| 2003/0208742 A1* | 11/2003 | LaCour | 716/21 |
| 2005/0177810 A1* | 8/2005 | Heng et al. | 716/21 |
| 2007/0162887 A1* | 7/2007 | Suh et al. | 716/21 |
| 2007/0266346 A1* | 11/2007 | Wu | 716/2 |
| 2008/0059918 A1* | 3/2008 | Bergeron et al. | 716/2 |
| 2010/0146465 A1* | 6/2010 | Berkens et al. | 716/2 |

OTHER PUBLICATIONS

A.E. Rosenbluth et al., "Optimum mask and source patterns to print a given shape," Society of photo-optical instrumentation engineers, JM3, Apr. 2002.
A.E. Rosenbluth et al., "Method for forming arbitrary lithographic wavefronts using standard mask technology," IBM disclosure YOR8-2005-0697, Oct. 4, 2007.
A.E. Rosenbluth et al., "Gobal optimization of masks, including film stack design to restore TM contrast to high NA TCC's," Proceedings-SPIE the International Society for Optical Engineering, year 2007.
A.E. Rosenbluth et al., "A method for global optimization of lithographic source intensities under contingent requirements," IBM disclosure YOR8-2007-0556, May 14, 2007.
A.E. Rosenbluth et al., "Global optimization of the illumination distribution to maximize integrated process window," Procs. of SPIE, year 2006.

* cited by examiner

*Primary Examiner* — Paul Dinh
*Assistant Examiner* — Bryce Aisaka
(74) *Attorney, Agent, or Firm* — Vazken Alexanian

(57) ABSTRACT

The manufacturability of a lithographic mask employed in fabricating instances of a semiconductor device is determined. Target edge pairs are selected from mask layout data of the lithographic mask to determine a manufacturing penalty in making the lithographic mask. The mask layout data includes polygons, where each polygon has edges, and where each target edge pair is defined by two of the edges of one or more of the polygons. The number of the target edge pairs is reduced to decrease computational volume in determining the manufacturing penalty in making the lithographic mask. The manufacturability of the lithographic mask, including the manufacturing penalty in making the lithographic mask, is determined based on the target edge pairs as reduced in number. The manufacturability of the lithographic mask is output. The manufacturability of the lithographic mask is dependent on the manufacturing penalty in making the lithographic mask.

18 Claims, 8 Drawing Sheets

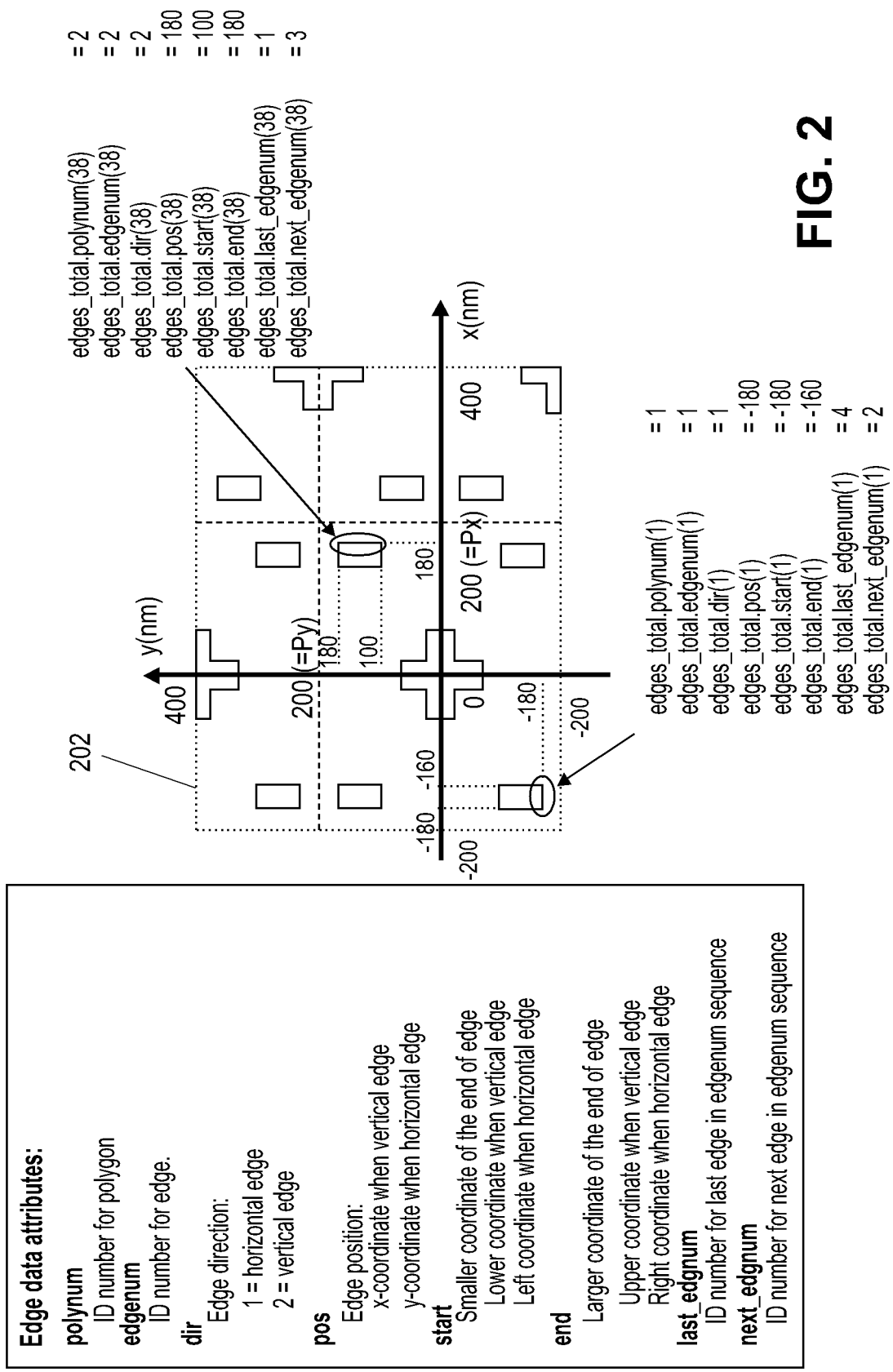

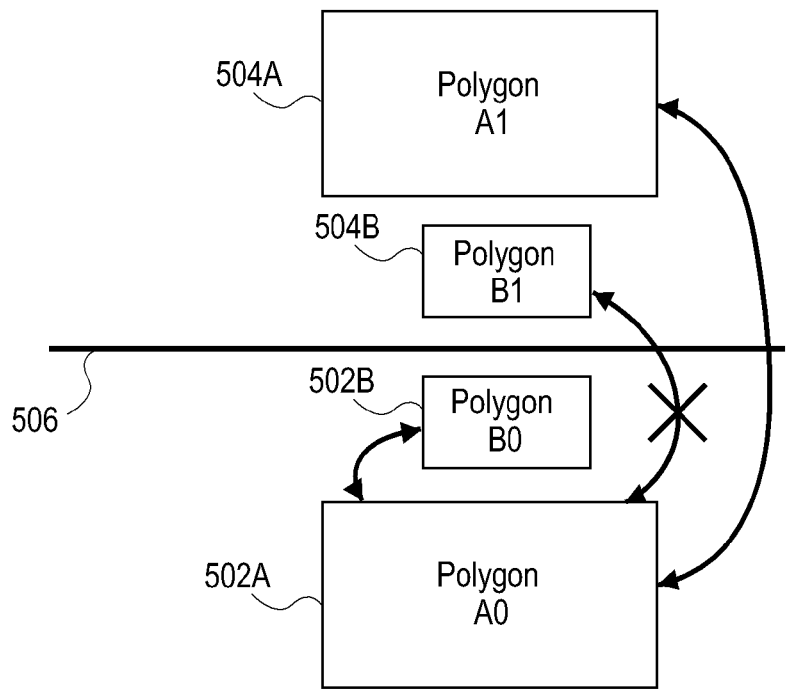
FIG. 5
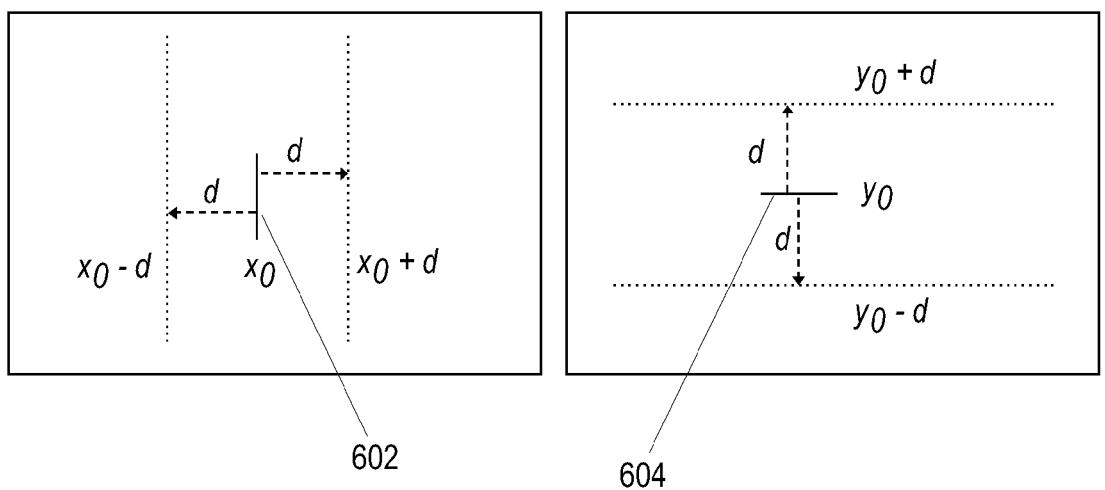
FIG. 6A    FIG. 6B

US 8,056,023 B2

DETERMINING MANUFACTURABILITY OF LITHOGRAPHIC MASK BY REDUCING TARGET EDGE PAIRS USED IN DETERMINING A MANUFACTURING PENALTY OF THE LITHOGRAPHIC MASK

RELATED PATENT APPLICATIONS

The present patent application is related to the following patent applications, which are hereby incorporated by reference:

(1) The patent application entitled "determining manufacturability of lithographic mask by selecting target edge pairs used in determining a manufacturing penalty of the lithographic mask," filed on Dec. 14, 2008, and assigned Ser. No. 12/334,485; and, (2) The patent application entitled "determining manufacturability of lithographic mask using continuous derivatives characterizing the manufacturability on a continuous scale," filed on Dec. 14, 2008, and assigned Ser. No. 12/334,488.

FIELD OF THE INVENTION

The present invention relates generally to determining the manufacturability of a lithographic mask employed in fabricating instances of a semiconductor device, and more particularly to determining such manufacturability by reducing the target edge pairs of edges of polygons in mask layout data as used to determine a manufacturing penalty in manufacturing the lithographic mask.

BACKGROUND OF THE INVENTION

Semiconductor devices include semiconductor processors, semiconductor memories, such as static random-access memories (SRAM's), and other types of semiconductor devices. A common semiconductor device fabrication process is photolithography. In photolithography, a semiconductor surface is selectively exposed to light through a lithographic mask. The semiconductor surface is developed, and the areas that were exposed to light (or the areas that were not exposed to light) are removed.

Therefore, to employ photolithography in fabricating instances of a given semiconductor device, a lithographic mask first has to be manufactured. However, depending on various aspects of the semiconductor device, such as its complexity, the lithographic mask can be relatively difficult (if not impossible) to manufacture, or relatively easy to manufacture. As such, it can be important to assess the manufacturability of a lithographic mask before the mask is actually made.

SUMMARY OF THE INVENTION

The present invention relates to determining the manufacturability of a lithographic mask, by reducing the target edge pairs used in determining a manufacturing penalty of the lithographic mask. A method of an embodiment of the invention determines the manufacturability of a lithographic mask that is employed in fabricating instances of a semiconductor device. The method may be implemented as one or more computer programs stored on a computer-readable medium, such as a tangible computer-readable medium like a recordable data storage medium. When executed, the computer programs perform the method.

The method selects a number of target edge pairs from mask layout data of the lithographic mask, which are used to determine the manufacturing penalty in making the mask. The mask layout data includes a number of polygons. Each polygon has a number of edges, and each target edge pair is defined by two of the edges of one or more of the polygons. The method then reduces the number of target edge pairs selected, in order to decrease the computational volume in determining the manufacturing penalty in making the mask. The method determines the manufacturability of the lithographic mask, including determining the manufacturing penalty in making the mask. The manufacturing penalty is determined based on the target edge pairs as have been reduced in number. The method finally outputs the manufacturability of the lithographic mask. This manufacturability is dependent on the manufacturing penalty in making the mask.

In one embodiment, reducing the number of target edge pairs can be achieved by performing one or more of the following (including performing all of the following in one embodiment). First, the mask layout data can include first and second polygons and first and second mirrored polygons. The first and second mirrored polygons are symmetrically laid out in a mirrored manner with respect to the first and second polygons. As such, the number of target edge pairs is reduced by ignoring the target edge pairs including the edges of the second mirrored polygon that are related to a manufacturing gap penalty between the first polygon and the second mirrored polygon. The manufacturing gap penalty itself relates to the penalty incurred in manufacturing the lithographic mask due to a gap between the first polygon and the second mirrored polygon.

Second, an edge of a third polygon of the mask layout data may be constrained to a range of possible movement. An edge of a fourth polygon of the mask layout data may fall completely outside the range of possible movement of the edge of the third polygon. As such, the number of target edge pairs is reduced by ignoring the target edge pairs including the edge of the fourth polygon related to the manufacturing penalty between the edge of the third polygon and the edge of the fourth polygon.

Third, the edges of a fifth polygon of the mask layout data may be adjacently ordered from a first edge to a last edge resulting from traversal of the edges of the fifth polygon in a clockwise or a counter-clockwise direction, such that each edge has a direction in correspondence with the traversal of the edges. Likewise, the edges of a sixth polygon of the mask layout data may be adjacently ordered from a first edge to a last edge resulting from traversal of the edges of the sixth polygon in the same clockwise or counter-clockwise direction, such that each edge also has a direction in correspondence with the traversal of the edges. As such, for the target edge pair including a given edge of the fifth polygon, the number of target edge pairs is reduced by ignoring the target edge pairs including particular edges of the sixth polygon. The particular edges are selected from all the edges of the sixth polygon based on the directions of the particular edges as compared to the direction of the given edge of the fifth polygon. The target edge pairs including these particular edges relate to a manufacturing gap penalty between the fifth polygon and the sixth polygon. The manufacturing gap penalty itself relates to a penalty incurred in manufacturing the lithographic mask due to a gap between the fifth polygon and the sixth polygon Embodiments of the invention provide for certain advantages. In particular, by reducing the number of target edge pairs on which basis the manufacturing penalty of the lithographic mask is determined, the manufacturing penalty—and hence the manufacturability of the lithographic mask itself—are determined more easily. That is, the computational volume (i.e., how much processing power and/or the length of time of such processing) in determining the manufacturing penalty in making the lithographic mask is reduced. This easier and less complex manufacturing penalty determination renders the manufacturability determination to be a more tractable problem, whereas prior to the improvements provided by embodiments of the invention, solving this problem could potentially be very intractable, if not impossible.

Still other aspects, advantages, and embodiments of the invention will become apparent by reading the detailed description that follows, and by referring to the following drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 2 is a diagram depicting representative mask layout data for a portion of a lithographic mask layout, according to an embodiment of the invention.

FIG. 5 is a diagram illustratively depicting a first approach to reducing the number of target edge pairs, according to an embodiment of the invention.

FIGS. 6A and 6B are diagrams depicting how a polygon edge may be constrained to a range of possible movement, according to an embodiment of the invention.

DETAILED DESCRIPTION OF THE DRAWINGS

Figure 1A:
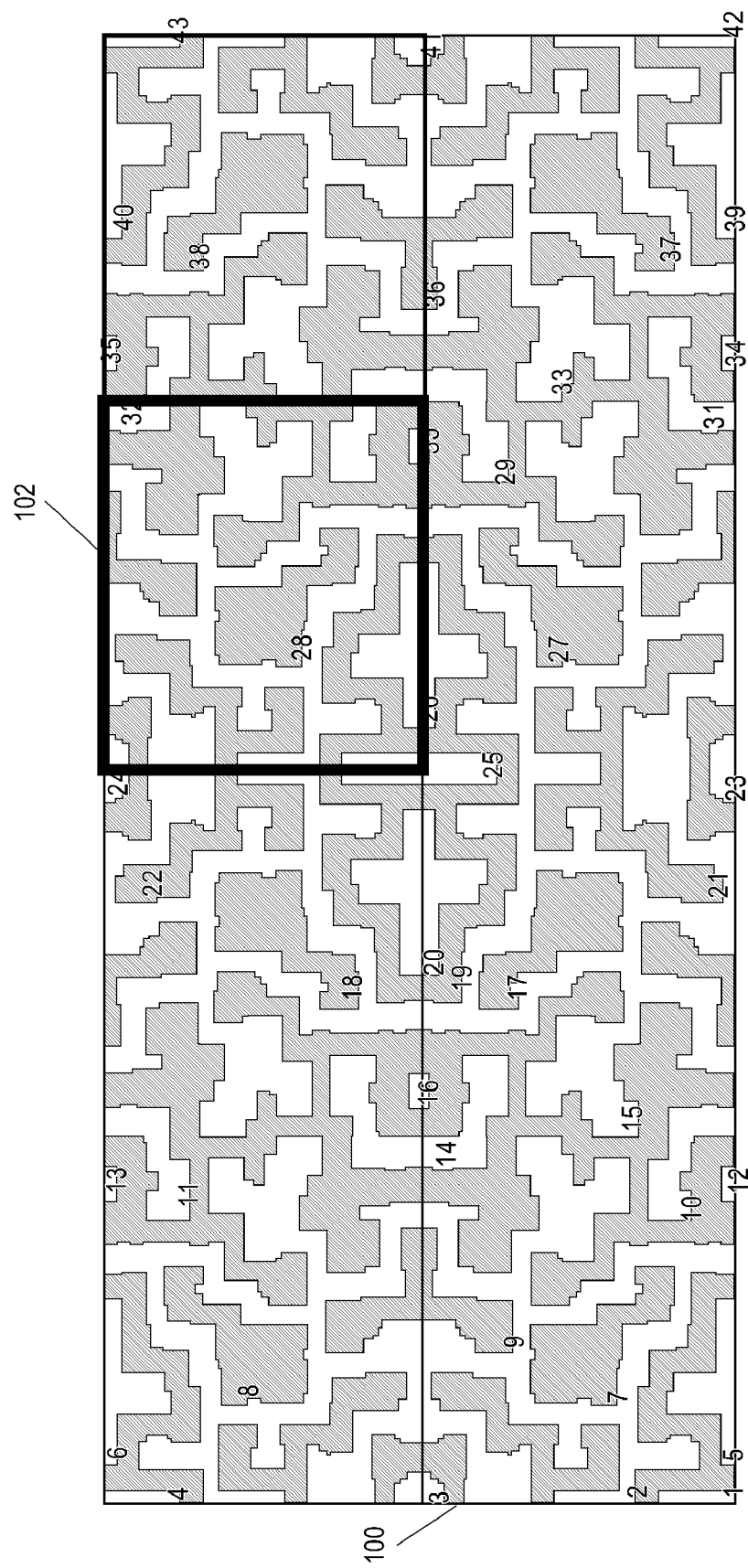
FIG. 1A is a diagram of a representative lithographic mask layout, according to an embodiment of the invention.
Figure 1B:
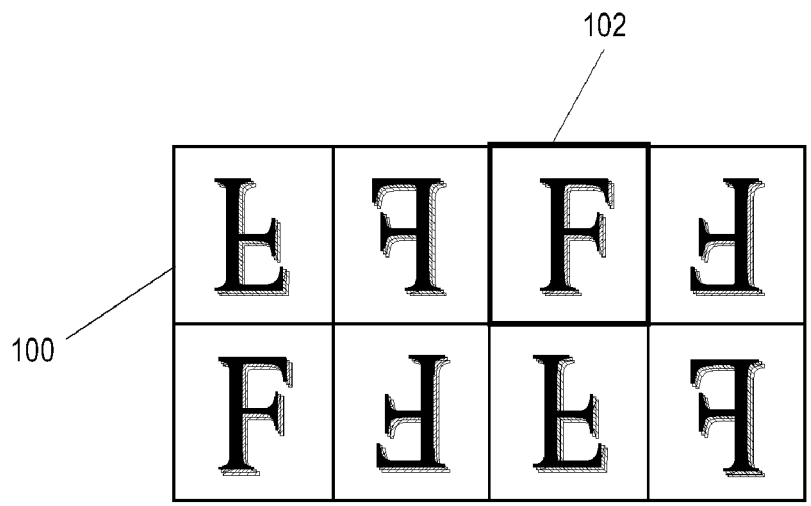
FIG. 1B is a diagram depicting the symmetry of the layout of FIG. 1A, according to an embodiment of the invention.
Figure 1C:
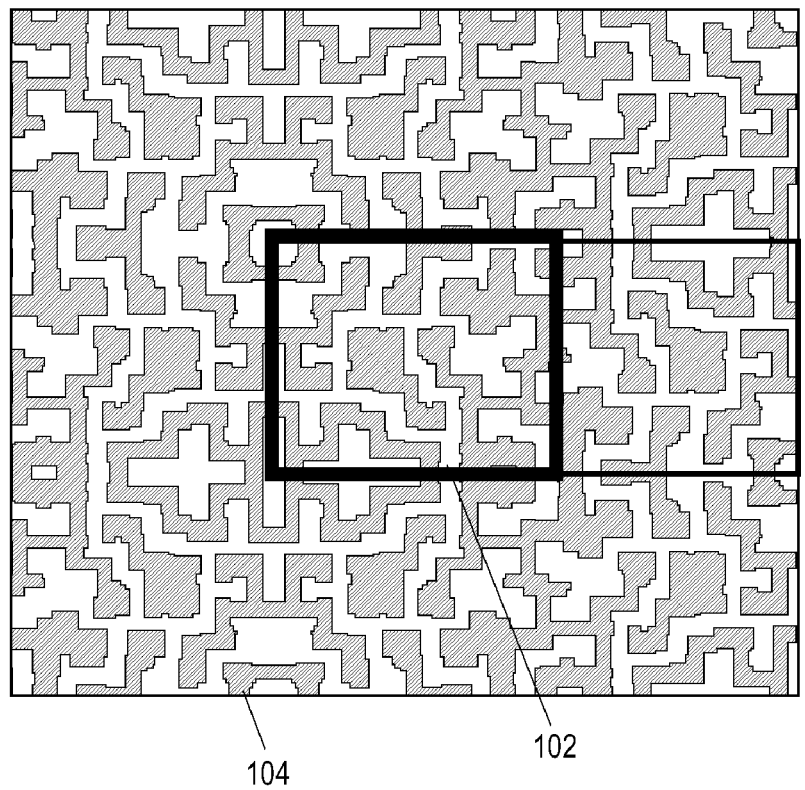
FIG. 1C is a diagram depicting the replication of a cell of the layout of FIG. 1A, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.
Technical Background and Overview FIG. 1A shows a representative lithographic mask layout 100, according to an embodiment of the invention. The litho-graphic mask layout 100 includes a cell 102 that is symmetrically duplicated throughout the layout 100. In particular, FIG. 1B shows the symmetry of the cell 102 within the lithographic mask layout 100, according to an embodiment of the invention. The letter F is used in FIG. 1B to denote the cell 102 in the layout 100 of FIG. 1A, and the various iterations of the letter F in FIG. 1B show how the cell 102 is symmetrically duplicated throughout the layout 100 in FIG. 1A. The symmetry in FIG. 1B can be referred to as a staggered symmetry. To assess the manufacturability of the lithographic mask layout 100, particularly at the boundaries of the cell 102, the mask layout data underlying the layout 100 is replicated over n-by-n units, where n may be equal to three. For instance, FIG. 1C shows such a replication 104 based on the cell 102, according to an embodiment of the invention.

FIG. 2 shows representative mask layout data for a portion 202 of the lithographic mask layout 100, according to an embodiment of the invention. It is noted that the lithographic mask layout 100 includes a number of polygons. Each polygon has a number of edges. An edge pair is defined as a pair of different edges, of the same or different polygons. For example, an edge pair may include two different edges of the same polygon, or an edge pair may include two edges of different polygons.

Furthermore, each edge of each polygon can have a number of attributes: polynum, edgenum, dir, pos, start, end, last_edgenum, and next_edgenum. Polynum is the identification for of the polygon to which the edge in question belongs. Edgenum is the identification of the edge in question within this polygon. Dir is the edge direction, where a first value, like one, may specify the horizontal direction, and a second value, like two, may specify the vertical direction. Pos is the edge position, including the x-coordinate for a vertical edge and a y-coordinate for a horizontal hedge. Start is the smaller coordinate of the end of the edge, which is the lower coordinate for a vertical edge, and the left coordinate for a horizontal edge. End is the larger coordinate of the end of the edge, which is the upper coordinate for a vertical edge, and the right coordinate for a horizontal edge. Last_edgenum is the identification number of the previously connected edge within the same polygon, in a prespecified direction (i.e., clockwise or counter-clockwise). Similarly, next_edgenum is the identification number of the next connected edge within the same polygon, in the prespecified direction.

Figure 3A:
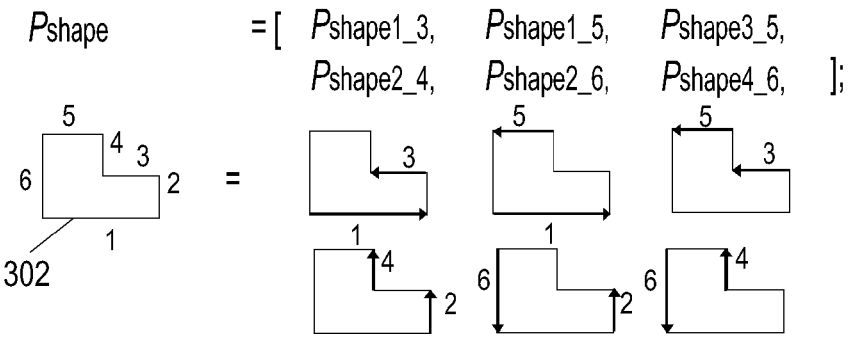
FIGS. 3A, 3B, and 3C are diagrams representing three different types of manufacturing penalties that can occur when determining the manufacturability of a lithographic mask, according to an embodiment of the invention.
Figure 3B:
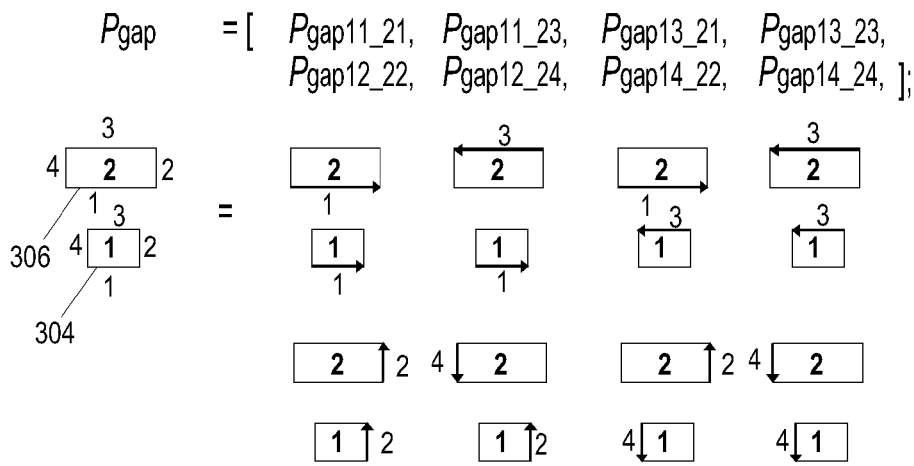
Figure 3C:
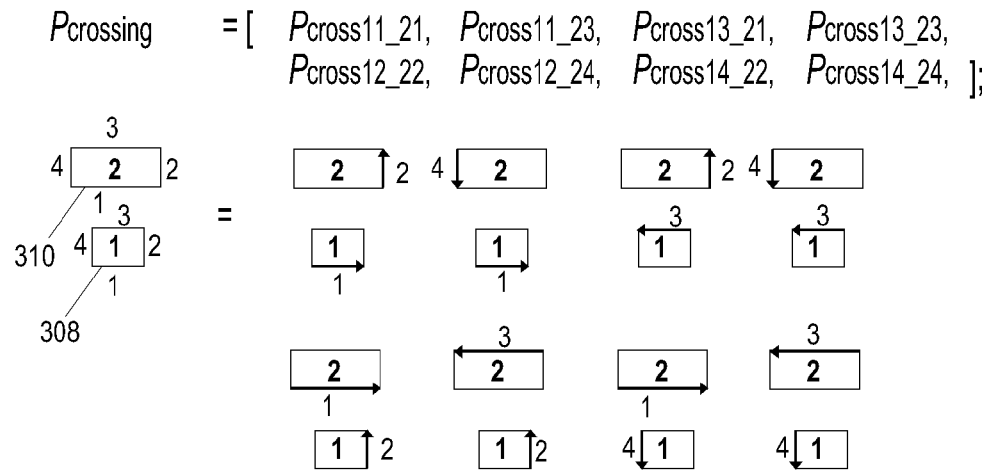

FIGS. 3A, 3B, and 3C represent three different types of manufacturing penalties that can occur when determining the manufacturability of a lithographic mask, according to varying embodiments of the invention. FIG. 3A particularly shows a penalty for the shape of a single polygon, which is referred to as a shape penalty. FIG. 3B particularly shows a penalty for the gap between two different polygons, which is referred to as a gap penalty. FIG. 3C particularly shows a penalty for crossing edges between two different polygons, which is referred to as a crossing penalty.

In FIG. 3A, the polygon 302 has six edges. Each different pair of parallel edges within this polygon 302 makes up a target edge pair that represents a corresponding shape penalty for the polygon 302, as depicted on the right-hand side of FIG. 3A. In FIG. 3B, the polygons 304 and 306 each has four edges. Each different pair of parallel edges of the polygons 304 and 306 (i.e., with one edge from the polygon 304 and one edge from the polygon 306) makes up a target edge pair that represents a corresponding gap penalty for the two polygons 304 and 306, as depicted on the right-hand side of FIG. 3B. In FIG. 3C, the polygons 308 and 310 each has four edges. Each different pair of non-parallel, or crossing, edges of the polygons 308 and 310 (i.e., with one edge from the polygon 308 and one edge from the polygon 310) makes up a target edge pair that represents a corresponding crossing penalty for the two polygons 308 and 310.

A shape penalty is a manufacturing penalty incurred in manufacturing the lithographic mask due to the shape of a polygon, owing to the difficulty in making the shape. Thus, a target edge pair can define the two edges of a given polygon that represent a shape penalty. A gap penalty is a manufacturing penalty incurred in manufacturing the lithographic mask due to the gap between two polygons, owing to the difficulty in maintaining this gap. Thus, a target edge pair can define the two edges of two different polygons that represent a gap penalty. A crossing penalty is a manufacturing penalty incurred in manufacturing the lithographic mask due to the potential for overlap by two polygons and a bow tie shape by one polygon, owing to the difficulty in insuring that such shapes do not occur. Thus, a target edge pair can define the horizontal and vertical edges that represent a crossing penalty.

Figure 4:
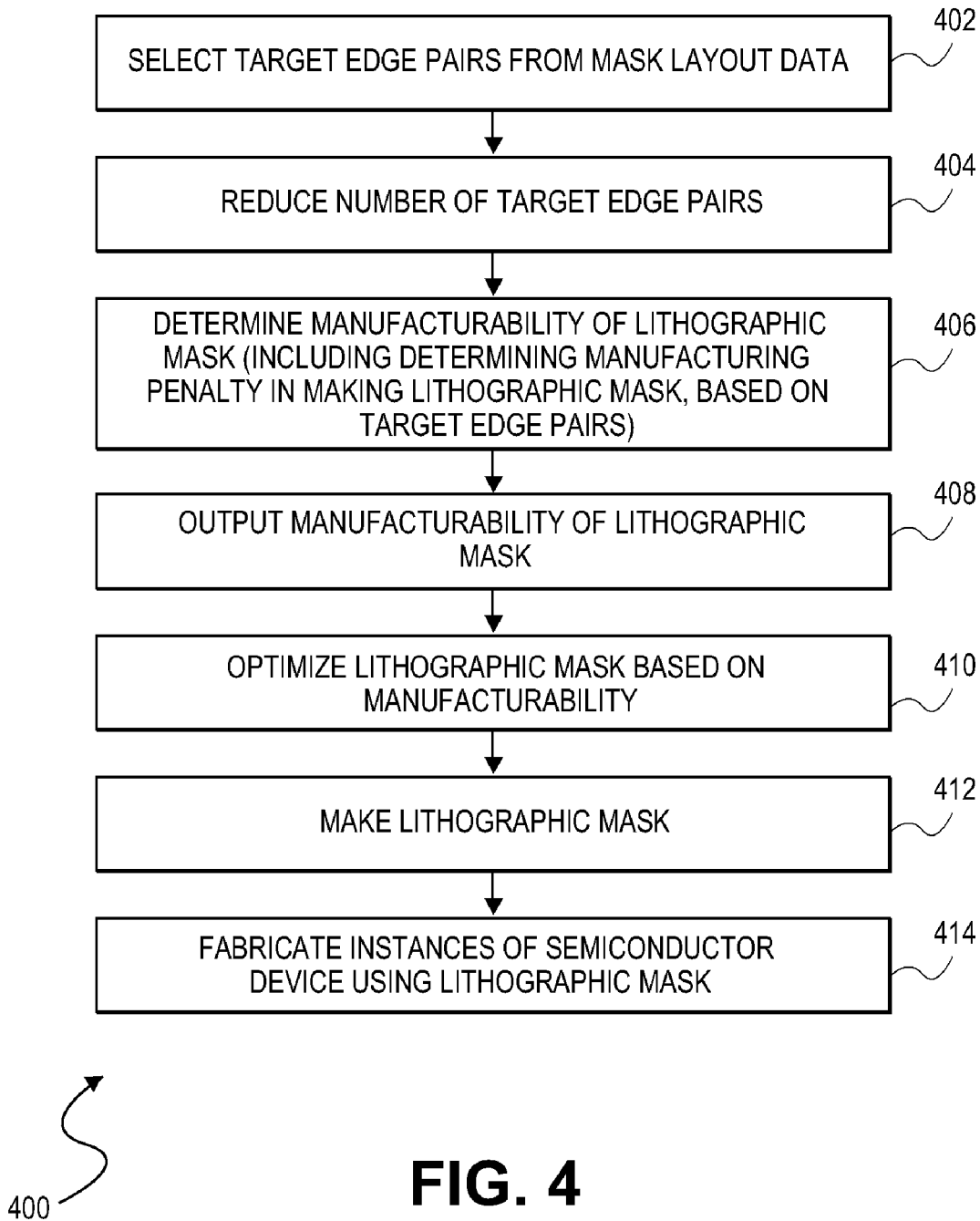
FIG. 4 is a flowchart of a method, according to an embodiment of the invention.

FIG. 4 shows a method 400 for determining the manufacturability of a lithographic mask used to fabricate instances of a semiconductor device, according to an embodiment of the invention. Target edge pairs are selected from mask layout data representing a lithographic mask (402). The target edge pairs are selected to represent each potential instance of a manufacturing penalty, such as a shape penalty, a gap penalty, or a crossing penalty. That is, in at least some embodiments, target edge pairs are identified in part 402 that represent all potential instances of manufacturing penalties like shape, gap, and crossing penalties. It is noted that the number of such target edge pairs is relatively large, and increases explosively on a cell-by-cell basis, such as the cell 102 of FIG. 1C that has been described.

Therefore, embodiments of the invention reduce the number of target edge pairs (404), to remove those target edge pairs that are not likely to actually represent manufacturing penalties. It is said that such target edge pairs are ignored, in that the manufacturability of the lithographic mask and/or the manufacturing penalty in making the lithographic mask are determined without consideration of these target edge pairs. Subsequent sections of the detailed description describe three different ways by which the number of target edge pairs can be reduced (i.e., by ignoring selected target edge pairs), in accordance with various embodiments of the invention.

Thereafter, the manufacturability of the lithographic mask is determined (406), which includes determining the manufacturing penalty in making the lithographic mask, based on the target edge pairs. The manufacturing penalty in making the lithographic mask can include the shape, gap, and crossing penalties that have been described. By reducing the number of target edge pairs in part 404 that are considered in making the determinations in part 406, the complexity of these determination is reduced, and rendered more tractable.

Once the manufacturability of the lithographic mask has been determined, it is output (408). For instance, the manufacturability may be displayed on a display device of a computer for viewing by a user. The method 400 of FIG. 4, including at least parts 402, 404, 406, and 408, may be performed by one or more computer programs, which may be executed by one or more processors of one or more computer devices, as can be appreciated by those of ordinary skill within the art.

Ultimately, the lithographic mask may have its design optimized, based on the manufacturability determine, so that it is in fact easier to manufacture (410). In this respect, parts 402, 404, 406, 408, and 410 of the method 400 may be iteratively performed until a lithographic mask having a desired manufacturability difficulty has been achieved. Embodiments of the invention are not limited to the specific manner by which the manufacturability of the lithographic mask and the manufacturing penalty in making the lithographic mask is determined in part 406 and/or how the lithographic mask is optimized in part 410. It is noted that in at least some embodiments, part 406 may be considered as being implicitly performed as part of the optimization of part 410.

For example, in one embodiment, the approach described in the above-referenced patent application entitled "determining manufacturability of lithographic mask using continuous derivatives characterizing the manufacturability on a continuous scale," can be employed to optimize the lithographic mask, including determining the manufacturability of the mask and the manufacturing penalty in making the mask. In this approach, minimizing the manufacturability penalty of the lithographic mask is objective of nonlinear programming. The mask layout data are set as variables and frequency domain values are set as constraints. Then a nonlinear programming is solved to actually get the optimized lithographic mask in manufacturability. Once a final design for the lithographic mask has been approved, the lithographic mask may be made (412), and instance of a semiconductor device fabricated using the lithographic mask (414).

Thus, embodiments of the invention advantageously provide for reducing the number of target edge pairs that are used in assessing the manufacturability of a lithographic mask. By reducing the number of target edge pairs, determining the mask's manufacturability is more easily and more quickly achieved. The following sections of the detailed description present three different manners by which the number of target edge pairs can be reduced in accordance with various embodiments of the invention. It is noted that these three approaches can be used individually or together.

First Approach To Reduce Target Edge Pairs

FIG. 5 illustratively depicts the first approach to reducing the number of target edge pairs in part 404 of FIG. 4, according to an embodiment of the invention. The mask layout data includes polygons 502A and 502B, collectively referred to as the polygons 502, and mirrored polygons 504A and 504B, collectively referred to as the mirrored polygons 504. The mirrored polygons 504 are symmetrically laid out in a mirrored manner with respect to the polygons 502 in relation to the boundary line 506. Thus, polygon 504A mirrors the polygon 502A in that it has the same shape and size of the polygon 502A and is the same distance away from the boundary 506 as the polygon 502A is. Likewise, the polygon 504B mirrors the polygon 502B in that it has the same shape and size of the polygon 502B and is the same distance away from the boundary 506 as the polygon 502B is.

With respect to the polygon 502A, target edge pairs including edges of the polygon 502B and the mirrored polygon 504A are still considered as to manufacturing gap penalties between the polygon 502A and the polygons 502B and 504A. However, again with respect to the polygon 502A, target edge pairs including edges of the mirrored polygon 504B are not considered as to a manufacturing gap penalty between the polygon 502A and the mirrored polygon 504B. Removing, or ignoring, these target edge pairs reduces the total number of target edge pairs in part 404 of FIG. 4.

Ignoring the target edge pairs including the polygon 502A and the mirrored polygon 504B as to a manufacturing gap penalty between the polygons 502A and 504B does not result in a great reduction in the accuracy of the determination of the manufacturability of the lithographic mask, however. This is because a large manufacturing gap penalty already results between the polygon 502A and the polygon 502B, such that the gap penalty between the polygon 502A and the mirrored polygon 504B is by comparison relatively small. By comparison, the target edge pairs including the polygon 502A and the mirrored polygon 504A as to a manufacturing gap penalty between the polygons 502A and 504A are still considered.

Second Approach to Reduce Target Edge Pairs

FIGS. 6A and 6B show how edges of a polygon of mask layout data may be constrained to a range of possible movement, according to an embodiment of the invention. In FIG. 6A, the vertical edge 602 is able to move in a horizontal direction by a distance d away from its nominal position $x_0$. Similarly, in FIG. 6B, the horizontal edge 604 is able to move in a vertical direction by a distance d away from its nominal position $y_0$.

Thus, the linear constraints to the movement of an edge movement can be mathematically expressed as follows, where x specifies the horizontal position of an edge end and y specifies the vertical position of an edge end:

$$x_0 - d \leq x \leq x_0 + d$$

$$y_0 - d \leq y \leq y_0 + d$$

The movement constraints of polygon edges can result from a number of different causes, such as frequency domain constraints, diffraction order errors, and mask error enhancement factors, among other different causes.

Figure 7A:
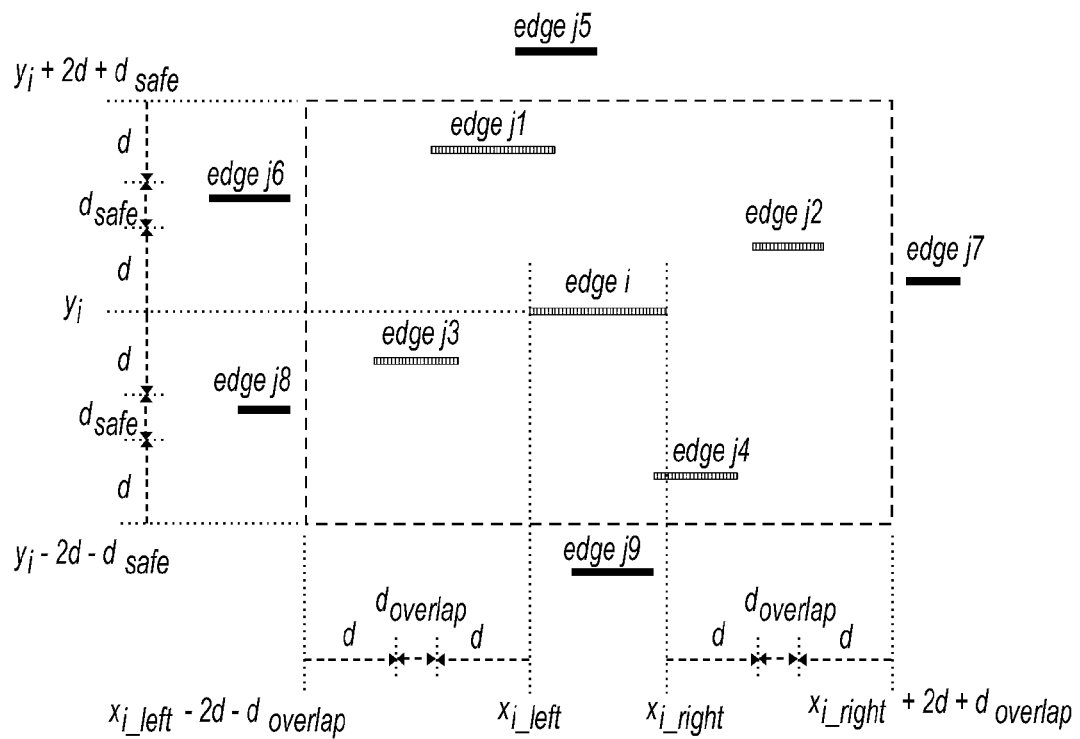
FIGS. 7A and 7B are diagrams illustratively depicting a second approach to reducing the number of target edge pairs, according to an embodiment of the invention.
Figure 7B:
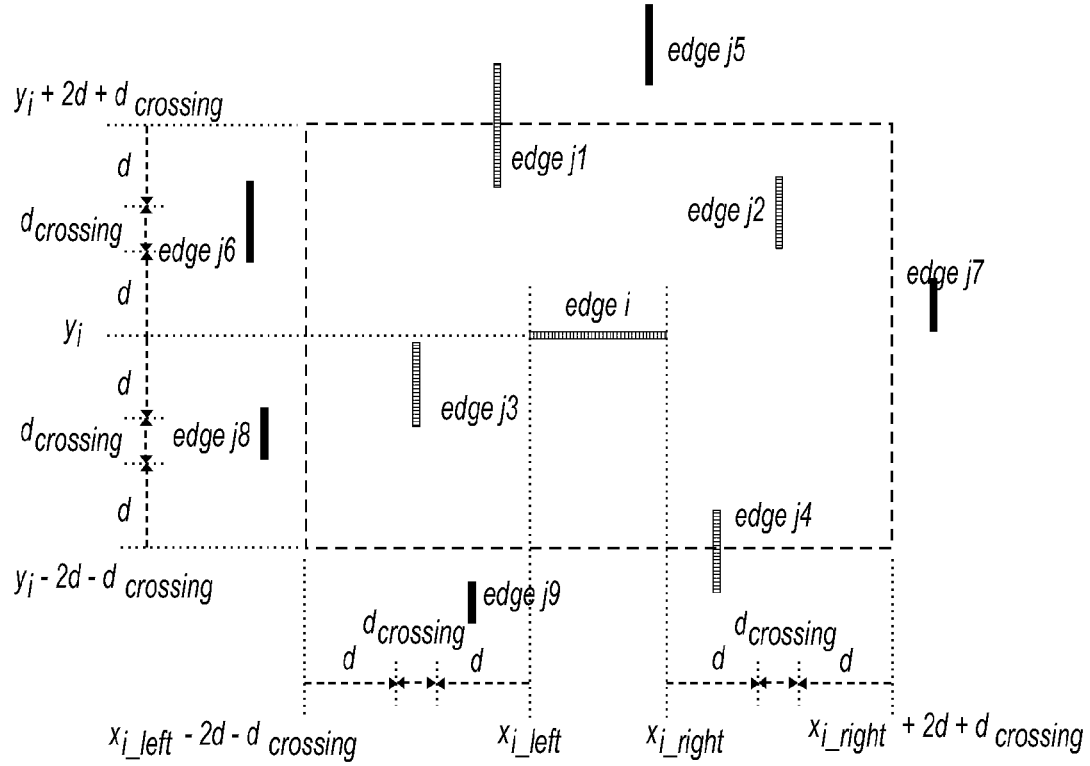

FIGS. 7A and 7B illustratively depict the second approach to reducing the number of target edge pairs in part 404 of FIG. 4, according to an embodiment of the invention. The mask layout data includes an edge i of a polygon. The mask layout data also includes edges j1, j2, ..., j9, collectively referred to as the edges j, of one or more polygons, potentially including the same polygon of which the edge i is a part. In FIG. 7A, the edges j are at least substantially parallel to the edge i, whereas in FIG. 7B, the edges j are at least substantially non-parallel, such as perpendicular, to the edge i.

The second approach reduces the number of target edge pairs by ignoring the target edge pairs including any edge j that falls completely outside the range of possible movement of the edge i. That is, since the edge i cannot move outside of a given range of possible movement, the target edge pairs including any edge j related to a potential manufacturing penalty between the edge i and such an edge j can be ignored, because such manufacturing penalties are very small, if not zero. The manufacturing penalty in question can be a shape or a gap penalty, or a crossing penalty, as is now discussed in more detail.

In FIG. 7A specifically, the edges j are at least substantially parallel to the edge i, as has been noted above. As such, FIG. 7A reflects the situation of both shape penalties where the edges j are part of the same polygon as the edge i is a part, as well as gap penalties where the edges j are not part of the same polygon as the edge i is a part. That is, FIG. 7A can be considered as reflecting shape penalties where there is just one polygon including all the edges i and j, and as reflecting gap penalties where there are at least two polygons, with one polygon including the edge i, and one or more other polygons including the edges j.

The target edge pair including a given edge j and the edge i has to be considered just where the edge j satisfies all of the following conditions, which define the range of possible movement of the edge i denoted by the dotted-line box in FIG. 7A:

$$x_{i\_left} - 2D - d_{overlap} \leq x_{j\_right}$$

$$x_{j\_left} \leq x_{i\_right} + 2d + d_{overlap}$$

$$y_i - 2d - d_{safe} \leq y_j \leq y_i + 2d + d_{safe}$$

Here, $x_{i\_left}$ and $x_{i\_right}$ are the x-coordinates of the edge ends for edge i; likewise, $x_{j\_left}$ and $x_{j\_right}$ are the x-coordinates of the edge ends for a given edge j. Similarly, $y_i$ and $y_j$ are the y-coordinates of the edges i and j. The maximum distance of edge movement is specified by d, $d_{overlap}$ is a buffer distance, and $d_{safe}$ is a minimum safety gap distance. If the gap distance is larger than $d_{safe}$, then the edge j in question is not considered for manufacturing gap penalty between the edge i and this edge j.

Therefore, in FIG. 7A, the edges j5 through j9 can be ignored, as they fall out of the possible range of movement of the edge i, as indicated by the dotted-line box. That is target edge pairs including the edge i and the edges j5 through j9 can be removed from the set of target edge pairs that is considered when determining the manufacturability of the lithographic mask. By comparison, the edges j1 through j4 are not ignored, as they fall inside the possible range of movement of the edge i.

Next, in FIG. 7B specifically, the edges j are at least substantially perpendicular (i.e., non-parallel) to the edge i, as has been noted above. As such, FIG. 7B reflects the situation of crossing penalties where the edges j are edges having different directions as compared to the edge i. The target edge pair including a given edge j and the edge i has to be considered just where the edge j satisfies all of the following conditions, which define the range of possible movement of the edge i denoted by the dotted-line box in FIG. 7B:

$$y_i - 2D - d_{crossing} \leq y_{j\_upper}$$

$$y_{j\_lower} \leq y_i + 2d + d_{crossing}$$

$$x_{i\_left} - 2d - d_{crossing} \leq x_j \leq x_{i\_right} + 2d + d_{crossing}$$

Here, $x_{i\_left}$ and $x_{i\_right}$ are the x-coordinates of the edge ends for horizontal edge i; $y_{j\_upper}$ and $y_{j\_lower}$ are the y-coordinates of the edge ends for a given vertical edge j. Similarly, $y_i$ and $x_j$ are the y-coordinate of the edge i and the x-coordinate of the edge j. The maximum distance of edge movement is specified by d, and $d_{crossing}$ is a buffer distance.

In FIG. 7B, then, the edges j5 through j9 can be ignored, as they fall out of the possible range of movement of the edge i, as indicated by the dotted-line box. That is, target edge pairs including the edge i and the edges j5 through j9 can be removed from the set of target edge pairs that is considered when determining the manufacturability of the lithographic mask. By comparison, the edges j1 through j4 are not ignored, as they fall inside the possible range of movement of the edge i.

Third Approach to Reduce Target Edge Pairs

Figure 8:
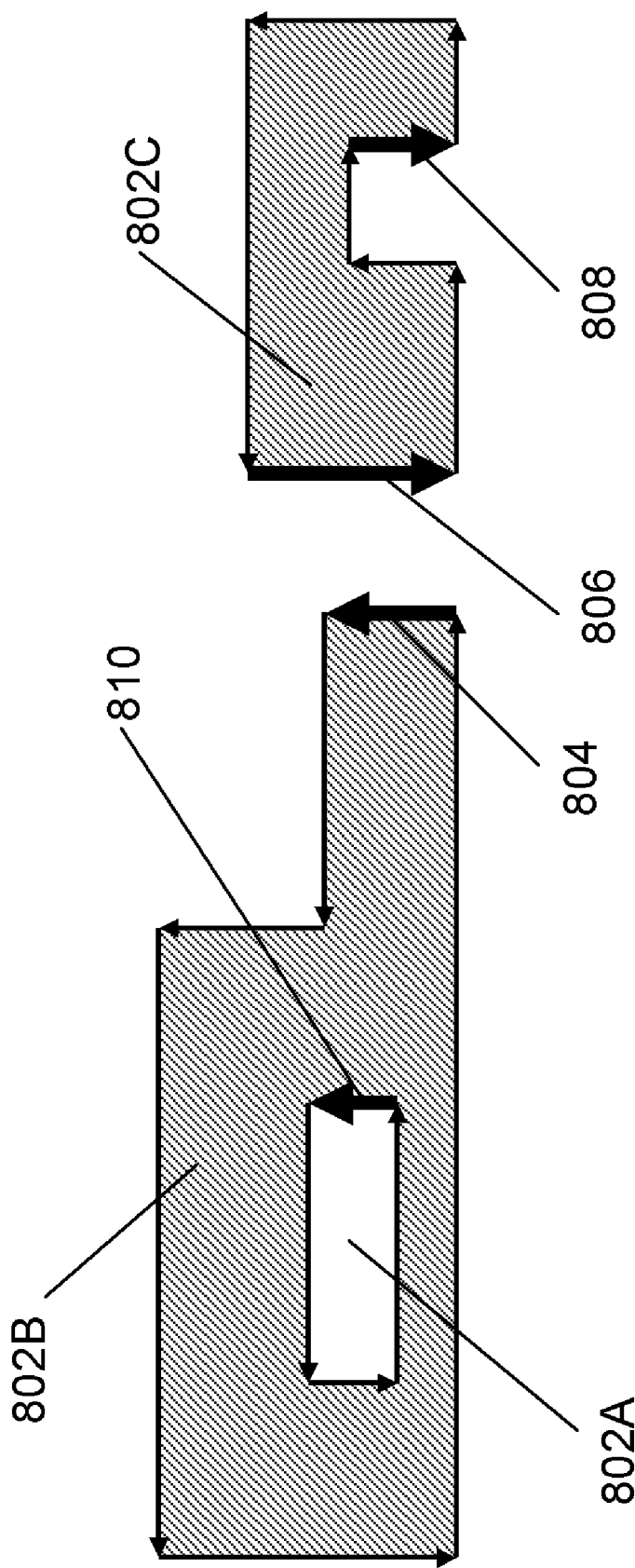
FIG. 8 is a diagram illustratively depicting a third approach to reducing the number of target edge pairs, according to an embodiment of the invention.

FIG. 8 illustratively depicts a third approach to reducing the number of target edge pairs in part 404 of FIG. 4, according to an embodiment of the invention. FIG. 8 includes three polygons 802A, 802B, and 802C, collectively referred to as the polygons 802. The edges of each polygon 802 are traversed in a counter-clockwise (or, alternatively, in a clockwise) manner. Each edge has a start coordinate and an end coordinate, permitting the edges to be treated as signed vector quantities. In defining edge vectors in this way, the vertical edge at the left-most position is a down vector and the vertical edge at the right-most position is an up vector. Similarly, the horizontal edge at the upper-most position is a left vector and the horizontal edge at the lower-most position is a right vector.

Stated another way, the edges of each polygon 802 are adjacently ordered from a first edge to a last edge, resulting from traversal of the edges in a counter-clockwise (or, alternatively, in a clockwise) direction, such that each edge has a direction in correspondence with how the edges were traversed. For example, the polygon 802A has four edges. Starting from the upper left-hand corner and proceeding counter-clockwise, the first edge is the left-most edge pointing downwards, and the second edge is the bottom-most edge pointing to the right and is considered adjacent to the first edge because it shares an end point with the first edge. The third edge is the right-most edge pointing upwards and is considered adjacent to the second edge because it shares an end point with the second edge. The fourth edge is the top-most edge pointing to the left and is considered adjacent to the third and the first edges because it shares end points with the third and the first edges. The directions of the edges correspond to how the edges are traversed, specifically in a counter-clockwise manner in the example of FIG. 8.

The third approach reduces the number of target edge pairs by, for a given edge of a first polygon, ignoring the target edge pairs that include particular edges of a second polygon. The particular edges of the second polygon (i.e., that are ignored) are selected based on the directions of the particular edges of the second polygon as compared to the direction of the given edge of the first polygon. In particular, where the first polygon is inside the second polygon (which can be referred to as the first polygon being in-phase with the second polygon), the particular edges of the second polygon (i.e., that are ignored) are selected as those edges that have directions identical to the direction of the given edge of the first polygon. By comparison, where the first polygon is outside the second polygon (which can be referred to as the first polygon being out-of-phase with the second polygon), the particular edges of the second polygon (i.e., that are ignored) are selected as those edges that have directions different than the direction of the given edge of the second polygon.

For example, the shaded polygon 802B in FIG. 8 and the shaded polygon 802C are mask patterns which have same phase and the white polygon 802A is blank which is the different phase. As to the right-most edge 804 of the polygon 802B, which points upward, the target edge pairs including the edges of the polygon 802C that point upward are ignored, and just the target edge pairs including the edges of the polygon 802C that point downward are not ignored, as indicated by the reference number 806 and 808. By comparison, as to the right-most edge of the polygon 802B, which points upward, the target edge pairs including the edges of the polygon 802A that point downward are ignored, and just the target edge pairs including the edges of the polygon 802A that point upward are not ignored, as indicated by the reference number 810. It is noted that these target edge pairs relate to manufacturing gap penalties between the polygon 802B and the polygons 802C and 802A.

Stated another way, for two given polygons, manufacturing gap penalties are considered just between edges of these two polygons that have different direction vectors, if the polygons have the same phase, such that edges having identical direction vectors are ignored, as is the case with the polygons 802B and 802C. Furthermore, for two given polygons, manufacturing gap penalties are considered just between edges of these two polygons that have identical direction vectors, if the polygons have different phases, such that edges having different direction vectors are ignored, as is the case with the polygons 802B and 802A. As such, the number of target edge pairs can be effectively reduced by a factor of two.

CONCLUSION

It is noted that, although specific embodiments have been illustrated and described herein, it will be appreciated by those of ordinary skill in the art that any arrangement calculated to achieve the same purpose may be substituted for the specific embodiments shown. This application is intended to cover any adaptations or variations of embodiments of the present invention. For example, a write-back cache may or may not be employed. Therefore, it is manifestly intended that this invention be limited only by the claims and equivalents thereof.

We claim:

1. A method for determining manufacturability of a lithographic mask employed in fabricating instances of a semiconductor device, comprising:
    selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;
    reducing a number of the target edge pairs to decrease computational volume in determining the manufacturing penalty in making the lithographic mask;
    determining the manufacturability of the lithographic mask, by a computer, including determining the manufacturing penalty in making the lithographic mask, where determining the manufacturing penalty is based on the target edge pairs as reduced in number; and,
    outputting the manufacturability of the lithographic mask, by the computer, where the manufacturability of the lithographic mask is dependent on the manufacturing penalty in making the lithographic mask,
    wherein reducing the number of the target edge pairs comprises:
        where the mask layout data comprises first and second polygons and first and second mirrored polygons, and where the first and second mirrored polygons are symmetrically laid out in a mirrored manner with respect to the first and second polygons, ignoring the target edge pairs including the edges of the second mirrored polygon related to a manufacturing gap penalty between the first polygon and the second mirrored polygon,
    and wherein the manufacturing gap penalty relates to a penalty incurred in manufacturing the lithographic mask due to a gap between the first polygon and the second mirrored polygon.

2. The method of claim 1, further comprising optimizing the lithographic mask based on the manufacturability of the lithographic mask determined and based on the manufacturing penalty determined.

3. The method of claim 1, further comprising making the lithographic mask.

4. The method of claim 3, further comprising fabricating the instances of the semiconductor device using the lithographic mask.

5. The method of claim 1, wherein outputting the manufacturability of the lithographic mask comprises displaying the manufacturability of the lithographic mask for viewing by a user.

6. A method for determining manufacturability of a lithographic mask employed in fabricating instances of a semiconductor device, comprising:
    selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

reducing a number of the target edge pairs to decrease computational volume in determining the manufacturing penalty in making the lithographic mask;

determining the manufacturability of the lithographic mask, by a computer, including determining the manufacturing penalty in making the lithographic mask, where determining the manufacturing penalty is based on the target edge pairs as reduced in number; and, outputting the manufacturability of the lithographic mask, by the computer, where the manufacturability of the lithographic mask is dependent on the manufacturing penalty in making the lithographic mask, wherein reducing the number of the target edge pairs comprises:

where an edge of a first polygon of the mask layout data is constrained to a range of possible movement, and where an edge of a second polygon of the mask layout data falls completely outside the range of possible movement of the edge of the first polygon, ignoring the target edge pairs including the edge of the second polygon related to the manufacturing penalty between the edge of the first polygon and the edge of the second polygon.

7. The method of claim 6, wherein the edge of the first polygon is constrained to the range of possible movement due to one or more of: a frequency domain constraint, a diffraction order error, and a mask error enhancement factor.

8. The method of claim 6, wherein the manufacturing penalty between the edge of the first polygon and the edge of the second polygon is a manufacturing gap penalty related to a penalty incurred in manufacturing the lithographic mask due to a gap between the first polygon and the second polygon, where the edge of the first polygon is at least substantially parallel to the edge of the second polygon, and where the first polygon and the second polygon are different polygons.

9. The method of claim 6, wherein the manufacturing penalty between the edge of the first polygon and the edge of the second polygon is a manufacturing shape penalty related to a penalty incurred in manufacturing the lithographic mask due a shape of the first polygon, where the edge of the first polygon is at least substantially parallel to the edge of the second polygon, and where the second polygon and the first polygon are a same polygon.

10. The method of claim 6, wherein the manufacturing penalty between the edge of the first polygon and the edge of the second polygon is a manufacturing crossing penalty related to a penalty incurred in manufacturing the lithographic mask due to potential overlap between the first polygon and the second polygon, where the edge of the first polygon is at least substantially non-parallel to the edge of the second polygon, and where the first polygon and the second polygon are different polygons.

11. A method for determining manufacturability of a lithographic mask employed in fabricating instances of a semiconductor device, comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

reducing a number of the target edge pairs to decrease computational volume in determining the manufacturing penalty in making the lithographic mask;

determining the manufacturability of the lithographic mask, by a computer, including determining the manufacturing penalty in making the lithographic mask, where determining the manufacturing penalty is based on the target edge pairs as reduced in number; and, outputting the manufacturability of the lithographic mask, by the computer, where the manufacturability of the lithographic mask is dependent on the manufacturing penalty in making the lithographic mask, wherein reducing the number of the target edge pairs comprises:

where the edges of a first polygon of the mask layout data are adjacently ordered from a first edge to a last edge resulting from traversal of the edges of the first polygon in one of a clockwise and a counter-clockwise direction, such that each edge has a direction in correspondence with the traversal of the edges, where the edges of a second polygon of the mask layout data are adjacently ordered from a first edge to a last edge resulting from traversal of the edges of the second polygon in a same one of the clockwise and a counter-clockwise direction, such that each edge has a direction in correspondence with the traversal of the edges, for a given edge of the first polygon, ignoring the target edge pairs including particular edges of the second polygon, the particular edges selected from all the edges of the second polygon based on the directions of the particular edges as compared to the direction of the given edge of the first polygon, and wherein the target edge pairs relate to a manufacturing gap penalty between the first polygon and the second polygon, and the manufacturing gap penalty relates to a penalty incurred in manufacturing the lithographic mask due to a gap between the first polygon and the second polygon.

12. The method of claim 11, wherein reducing the number of the target edge pairs further comprises:

where the first polygon is inside the second polygon, selecting the particular edges of the second polygon as the edges of the second polygon that the directions of which are identical to the direction of the given edge of the first polygon; and, where the first polygon is outside the second polygon, selecting the particular edges of the second polygon as the edges of the second polygon that the directions of which are different than the direction of the given edge of the first polygon.

13. A non-transitory computer-readable medium having one or more computer programs stored thereon, wherein execution of the computer programs by a computer causes a method to be performed, the method for determining manufacturability of a lithographic mask employed in fabricating instances of a semiconductor device, the method comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

reducing a number of the target edge pairs to decrease computational volume in determining the manufacturing penalty in making the lithographic mask, by performing one or more of:
  (a) where the mask layout data comprises first and second polygons and first and second mirrored polygons, and where the first and second mirrored polygons are symmetrically laid out in a mirrored manner with respect to the first and second polygons, ignoring the target edge pairs including the edges the second mirrored polygon related to a manufacturing gap penalty between the first polygon and the second mirrored polygon, the manufacturing gap penalty relating to a penalty incurred in manufacturing the lithographic mask due to a gap between the first polygon and the second mirrored polygon;
  (b) where an edge of a third polygon of the mask layout data is constrained to a range of possible movement, and where an edge of a fourth polygon of the mask layout data falls completely outside the range of possible movement of the edge of the third polygon, ignoring the target edge pairs including the edge of the fourth polygon related to the manufacturing penalty between the edge of the third polygon and the edge of the fourth polygon;
  (c) where the edges of a fifth polygon of the mask layout data are adjacently ordered from a first edge to a last edge resulting from traversal of the edges of the fifth polygon in one of a clockwise and a counter-clockwise direction, such that each edge has a direction in correspondence with the traversal of the edges, where the edges of a sixth polygon of the mask layout data are adjacently ordered from a first edge to a last edge resulting from traversal of the edges of the sixth polygon in a same one of the clockwise and a counter-clockwise direction, such that each edge has a direction in correspondence with the traversal of the edges, for the target edge pairs including a given edge of the fifth polygon, ignoring the target edge pairs including particular edges of the sixth polygon, the particular edges selected from all the edges of the sixth polygon based on the directions of the particular edges as compared to the direction of the given edge of the fifth polygon, where the target edge pairs relate to a manufacturing gap penalty between the fifth polygon and the sixth polygon, the manufacturing gap penalty relating to a penalty incurred in manufacturing the lithographic mask due to a gap between the fifth polygon and the sixth polygon; and,
determining the manufacturability of the lithographic mask, including determining the manufacturing penalty in making the lithographic mask, where determining the manufacturing penalty is based on the target edge pairs as reduced in number, and where the manufacturability of the lithographic mask is dependent on the manufacturing penalty in making the lithographic mask.

14. The computer-readable medium of claim 13, wherein the manufacturing penalty between the edge of the third polygon and the edge of the fourth polygon is a manufacturing gap penalty related to a penalty incurred in manufacturing the lithographic mask due to a gap between the third polygon and the fourth polygon, where the edge of third first polygon is at least substantially parallel to the edge of the second polygon, and where the fourth polygon and the third polygon are different polygons.

15. The computer-readable medium of claim 13, wherein the manufacturing penalty between the edge of the third polygon and the edge of the fourth polygon is a manufacturing shape penalty related to a penalty incurred in manufacturing the lithographic mask due a shape of the third polygon, where the edge of the third polygon is at least substantially parallel to the edge of the fourth polygon, and where the fourth polygon and the third polygon are a same polygon.

16. The computer-readable medium of claim 13, wherein the manufacturing penalty between the edge of the third polygon and the edge of the fourth polygon is a manufacturing crossing penalty related to a penalty incurred in manufacturing the lithographic mask due to potential overlap between the third polygon and the fourth polygon, where the edge of the third polygon is at least substantially non-parallel to the edge of the fourth polygon, and where the third polygon and the fourth polygon are different polygons.

17. The computer-readable medium of claim 13, wherein:
  where the fifth polygon is inside the sixth polygon, the particular edges of the second polygon are selected as the edges of the sixth polygon that the directions of which are identical to the direction of the given edge of the fifth polygon; and,
  where the fifth polygon is outside the sixth polygon, the particular edges of the sixth polygon are selected as the edges of the fifth polygon that the directions of which are different than the direction of the given edge of the fifth polygon.

18. A non-transitory computer-readable medium having one or more computer programs stored thereon, wherein execution of the computer programs by a computer causes a method to be performed, the method for determining manufacturability of a lithographic mask employed in fabricating instances of a semiconductor device, the method comprising:
  selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;
  reducing a number of the target edge pairs to decrease computational volume in determining the manufacturing penalty in making the lithographic mask, by performing:
    (a) where the mask layout data comprises first and second polygons and first and second mirrored polygons, and where the first and second mirrored polygons are symmetrically laid out in a mirrored manner with respect to the first and second polygons, ignoring the target edge pairs including the edges of the second mirrored polygon related to a manufacturing gap penalty between the first polygon and the second mirrored polygon, the manufacturing gap penalty relating to a penalty incurred in manufacturing the lithographic mask due to a gap between the first polygon and the second mirrored polygon;
    (b) where an edge of a third polygon of the mask layout data is constrained to a range of possible movement, and where an edge of a fourth polygon of the mask layout data falls completely outside the range of possible movement of the edge of the third polygon, ignoring the target edge pairs including the edge of the fourth polygon related to the manufacturing penalty between the edge of the third polygon and the edge of the fourth polygon;
    (c) where the edges of a fifth polygon of the mask layout data are adjacently ordered from a first edge to a last edge resulting from traversal of the edges of the fifth polygon in one of a clockwise and a counter-clockwise direction, such that each edge has a direction in correspondence with the traversal of the edges, where the edges of a sixth polygon of the mask layout data are adjacently ordered from a first edge to a last edge resulting from traversal of the edges of the sixth polygon in a same one of the clockwise and a counter-clockwise direction, such that each edge has a direction in correspondence with the traversal of the edges, for the target edge pair including a given edge of the fifth polygon, ignoring the target edge pairs including particular edges of the sixth polygon, the particular edges selected from all the edges of the sixth polygon based on the directions of the particular edges as compared to the direction of the given edge of the fifth polygon, where the target edge pairs relate to a manufacturing gap penalty between the fifth polygon and the sixth polygon, the manufacturing gap penalty relating to a penalty incurred in manufacturing the lithographic mask due to a gap between the fifth polygon and the sixth polygon; and, determining the manufacturability of the lithographic mask, including determining the manufacturing penalty in making the lithographic mask, where determining the manufacturing penalty is based on the target edge pairs as reduced in number, and where the manufacturability of the lithographic mask is dependent on the manufacturing penalty in making the lithographic mask.

\* \* \* \* \*